United States Patent [19]
Torres et al.

[11] Patent Number: 5,898,213
[45] Date of Patent: Apr. 27, 1999

[54] SEMICONDUCTOR PACKAGE BOND POST CONFIGURATION

[75] Inventors: Victor Manuel Torres; Laxminarayan Sharma; Ashok Srikantappa, all of Austin, Tex.

[73] Assignee: Motorola, Inc., Schaumburg, Ill.

[21] Appl. No.: 08/888,392

[22] Filed: Jul. 7, 1997

[51] Int. Cl.⁶ .............................................. H01L 23/495
[52] U.S. Cl. ........................ 257/666; 257/737; 257/778; 257/786
[58] Field of Search ................................ 257/666, 786, 257/667, 672, 676, 737, 738, 778

[56] References Cited

U.S. PATENT DOCUMENTS

| | | | |
|---|---|---|---|
| 3,102,479 | 9/1963 | Severance | 102/71 |
| 3,633,510 | 1/1972 | Bernardin | 102/74 |
| 3,636,880 | 1/1972 | Aske | 102/71 R |
| 3,961,578 | 6/1976 | Popovitch | 102/78 |
| 4,029,016 | 6/1977 | Cole | 102/69 |
| 4,291,627 | 9/1981 | Ziemba et al. | 102/265 |
| 4,480,550 | 11/1984 | Abt | 102/215 |
| 4,567,830 | 2/1986 | Apotheloz | 102/271 |
| 4,667,598 | 5/1987 | Grobler et al. | 102/215 |
| 4,690,057 | 9/1987 | Carlsson | 102/266 |
| 5,157,221 | 10/1992 | Ronn | 102/216 |
| 5,359,227 | 10/1994 | Liang et al. | 257/784 |
| 5,444,303 | 8/1995 | Greenwood et al. | 257/666 |
| 5,468,999 | 11/1995 | Lin et al. | 257/784 |

OTHER PUBLICATIONS

"Construction Analysis of the Intel A80502–120 Pentium Processor", Report No. SUB9506–02, Integrated Circuit Engineering Corporation, Jun. 1995, 2 pp.

Primary Examiner—Peter Toby Brown
Assistant Examiner—Roy Potter
Attorney, Agent, or Firm—Robert L. King; Sandra L. Godsey

[57] ABSTRACT

A bond post configuration for wire bonded semiconductors has bond posts grouped in three posts where two are arranged closely to a side of a die about a first axis and a third is arranged in between and further removed from the side about a second axis. In one form, the bond post configuration is a radial configuration. Additionally, conductive traces which extend from the bond posts and away from the die are placed off-center from the the bond posts about the first axis to provide more placement area for the bond posts arranged about the second axis. The bond post configuration may be utilized in any wire bonded semiconductor.

21 Claims, 5 Drawing Sheets

SEMICONDUCTOR PACKAGE BOND POST CONFIGURATION

FIELD OF THE INVENTION

The present invention relates generally to semiconductor devices, and more specifically, to bond post configurations for semiconductor devices.

BACKGROUND OF THE INVENTION

As integrated circuits continue to evolve, lithography dimensions continue to decrease. Present day lithography is in the range of 0.1–0.2 micron. As a result, the semiconductor die continues to decrease in size. As a result of the decreased size of the semiconductor die, packaging issues are created that heretofore were non-existent. The decrease in semiconductor die size results in bond posts which are external to the die being removed farther and farther from the die in the semiconductor package, which encapsulates the die. As a result, the wires used to connect bond pads on the semiconductor die to bond posts in the package are becoming increasingly longer. Another issue is the high pin count resulting from increased integration afforded by the miniaturization. As a result of increased pin count, more pads per side of a package have to be included. The addition of pads to a side of an integrated circuit further increases the wire length because more bond posts have to be added farther from the side of the integrated circuit die.

Long wire length is problematic for several reasons. As first reason is the fact that long wire lengths result in many integrity problems such as shorting and wire sweep issues. Wire sweeping occurs when the encapsulant used to encapsulate the die is poured into a cavity and causes the wires to be swept in directions not anticipated. Additional issues with increased wire length include the degradation of electrical performance of the integrated circuit package.

As a result of these problems caused by increased wire length, package designers typically have a maximum wire length which cannot be exceeded in connection with implementing a package associated with the integrated circuit die.

Illustrated in FIG. 1 is a known integrated circuit package 10 having a die 12 with a plurality of bond pads, such as bond pads 13 and 14. Each bond pad has a bonding wire, such as bonding wire 16, connected to a respective bond post such as bond post 17. Bond post 17 is part of a conductive trace 18. As shown in FIG. 1, a respective bond pad is connected by a bonding wire to each bond post. From each bond post, a trace continues to the external periphery of the integrated circuit. It should be noted that integrated circuit package 10 has all of its bond posts orthogonal to a side of the integrated circuit die 12. As a result, all of the bonding wires, such as bonding wire 16, are connected substantially at a 90° angle to the side of the integrated circuit die. Additionally, each of the bond posts are made larger than each conductive trace in order to allow more room for automatic wire bonding to the bond post. A disadvantage with the integrated circuit package 10 is that the orthogonal arrangement limits the amount of bonding wires which may be used on a side of an integrated circuit die. Note in particular that bond posts, such as bond post 17, are aligned or stacked essentially one along the other so that the number of bond posts per side of a die is limited by the width of the bond post and the required separation between each of the bond posts.

Illustrated in FIG. 2, is an integrated circuit package 20. Integrated circuit package 20 has a die 22 which has a plurality of bond pads, such as bond pads 24 and 25. From each bond pad is a bonding wire, such as bonding wire 26 or 28, connected to a respective bond post, such as bond post 27 or 29. Integrated circuit package 20 has the same disadvantage of using bond posts which are orthogonal to a side of die 22. As a result, a finite number of bond posts may be placed along the side of die 22 limited in number by the physical dimension of the side of die 22. The orthogonal staggered configuration is desirable only for low pin count packages. However, integrated circuit package 20 has the advantage over integrated circuit package 10 of having staggered bond posts. That is to say that not all of the bond posts are lined up along a same axis. As a result, an equal number of bond posts to the number of bond posts in integrated circuit package 10 may be placed in integrated circuit package 20 in a slightly smaller area. An example of an integrated circuit package such as integrated circuit package 20 is taught in U.S. Pat. No. 5,468,999, entitled "Liquid Encapsulated Ball Grid Array Semiconductor Device With Fine Pitch Wire Bonding," by Lin, et al., and assigned to the assignee hereof.

There remains a need for an integrated circuit package which has high pin count and small bond wire length for use with lithography dimensions which are approaching one-tenth of a micron. Existing packaging technologies continue to be limiting with respect to the advances made by integrated circuit integration. As integrated circuit dimensions have continued to decrease, the width required of a bond post in order to make a reliable bond has not decreased. As a result, existing packaging technologies have become inadequate for advanced semiconductor technologies.

DETAILED DESCRIPTION OF THE INVENTION

Figure 1:
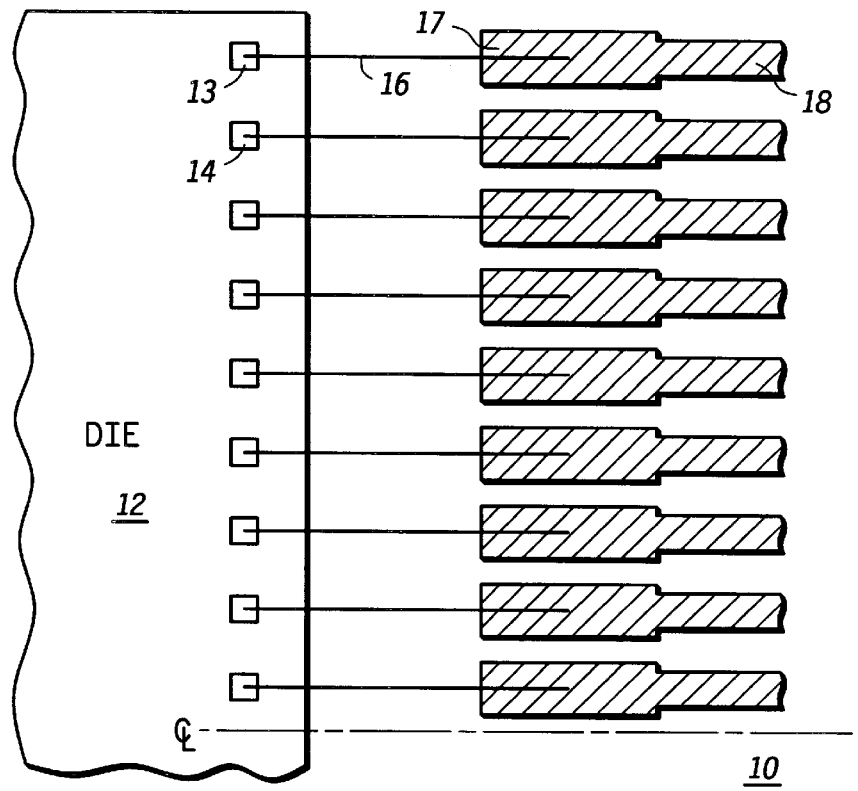
FIG. 1 illustrates in a top plan view a known bond finger design.
Figure 2:
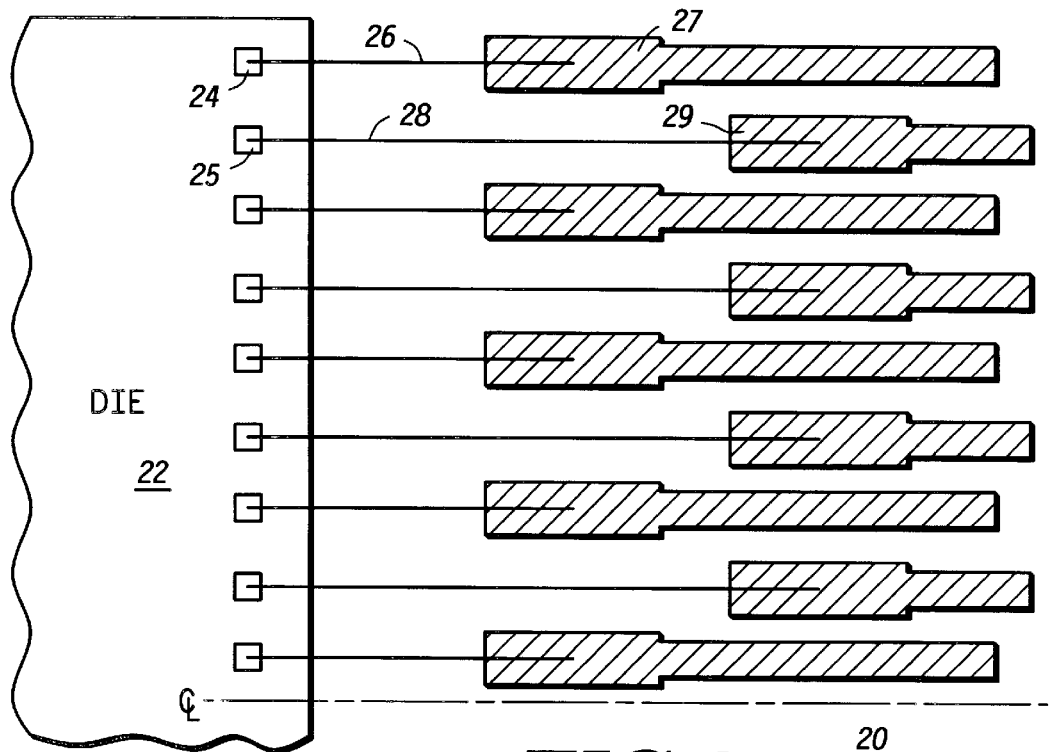
FIG. 2 illustrates in a top plan view another known bond finger design.
Figure 3:
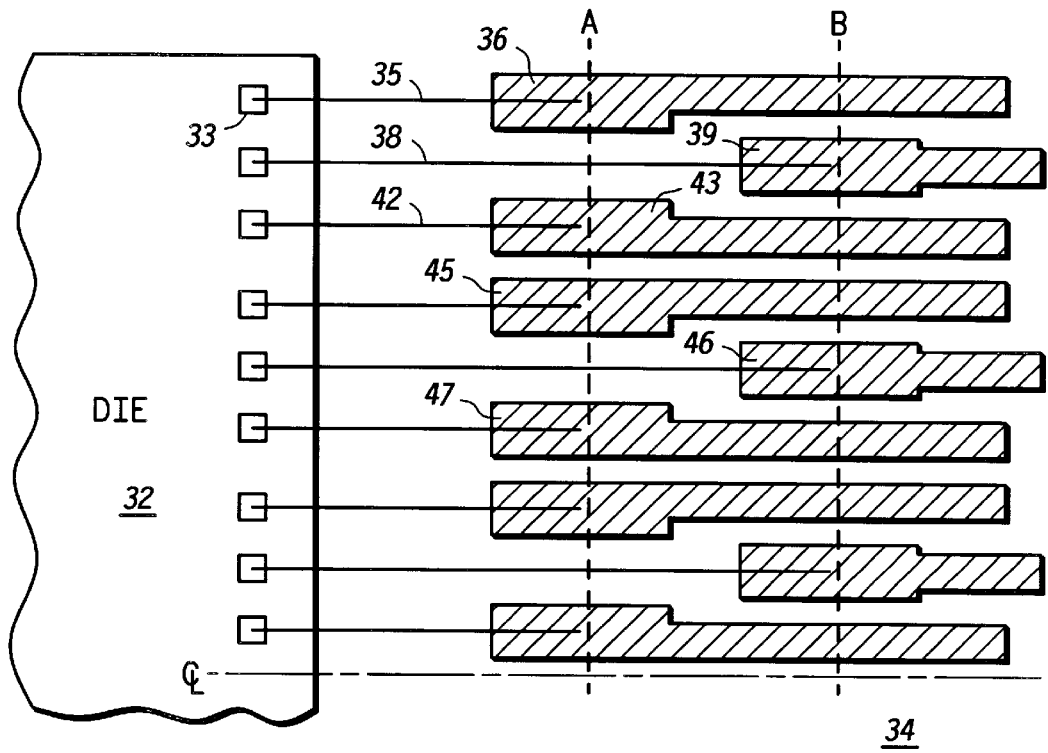
FIG. 3 illustrates in a top plan view a bond finger design in accordance with the present invention.

Illustrated in FIG. 3 is a portion of a semiconductor package 34 in accordance with the present invention. Integrated circuit package 34 has a die 32 with a plurality of bond pads such as bond pad 33. A plurality of bond wires such as bond wires 35, 38 and 42 are respectively connected to a bond pad. A bond wire 35 makes a connection between bond pad 33 and a conductive bonding post 36 which is forming a conductive trace. Similarly, a bonding wire 38 is connected to a conductive bond post 39 and a bonding wire 42 is connected to a conductive trace 43. It should be noted that bond post 36, 39 and 43 are arranged in a unique manner. Additionally, bond posts 45, 46 and 47 are similarly situated. In particular, bond posts 36 and 43 are arranged substantially around an axis labeled axis A and bond posts 39 and 46 are arranged around an axis labeled axis B. In the preferred form, it should be noted that bonding posts 36 and 43 do not have to be symmetrical with or exactly centered around axis A and bonding post 39 does not have to be centered around or symmetric with axis B. By using a staggered bond post configuration where bond post 39 is removed from the axis associated with bond posts 36 and 43. Similarly, the configuration is repeated for bond posts 43, 45, and 46 which then gets repeated by bond post 47 and so on. In particular, it should be noted that around axis A are two-thirds of the conductive bond posts and around axis B is the remaining third of bond posts. By using a staggered bond post configuration, substantially more bond posts are able to be associated with a side of a die such as die 32 then in either of the configurations of FIG. 1 or FIG. 2. Another advantage of the configuration of semiconductor package 34 is the fact that the bonding wires such as 35 and 42 are as short as the bonding wires of semiconductor package 10 of FIG. 1. By using the staggered bond post configuration of the FIG. 3, the bonding wires such as 38 are made only a small amount longer than bonding wires 35 and 42.

When viewing semiconductor package 34, it should be noted that conductive bond posts 36, 39 and 43 should be viewed together as a group. Similarly, conductive bond posts 45, 46 and 47 should be viewed as a second group adjacent to the first group. Because the two groups are adjacent, bond posts 43 and 45 are next to each other and centered around the same axis. However, the compactness which is provided in semiconductor package 34 is afforded by the use of staggering a bond post such as 39 between two adjacent bond posts 36 and 43, then the pattern is repeated. In the illustrated configuration, it should be noted that as a result, there are more conductive bond posts closer to the die than farther away from the die. In the preferred form, there are exactly twice as many bond posts placed closer to the integrated circuit die than staggered back one dimension further away.

An additional savings in area is achieved by integrated circuit package 34 as a result of making each conductive trace associated with the bond post around axis A not being centered with the center of the bond post. In contrast, each of the conductive traces associated with the staggered bond posts such as bond posts 39 and 46 is substantially centered around the bond post. In this manner, it should be noted that maximum space is afforded for each of the staggered bond posts such as bond posts 39 and 46. As a result of placing a 2:1 ratio of conductive bond posts along axis A versus axis B and off-balancing the conductive traces associated with the bond posts around axis A provides a very compact bond post configuration.

Figure 4:
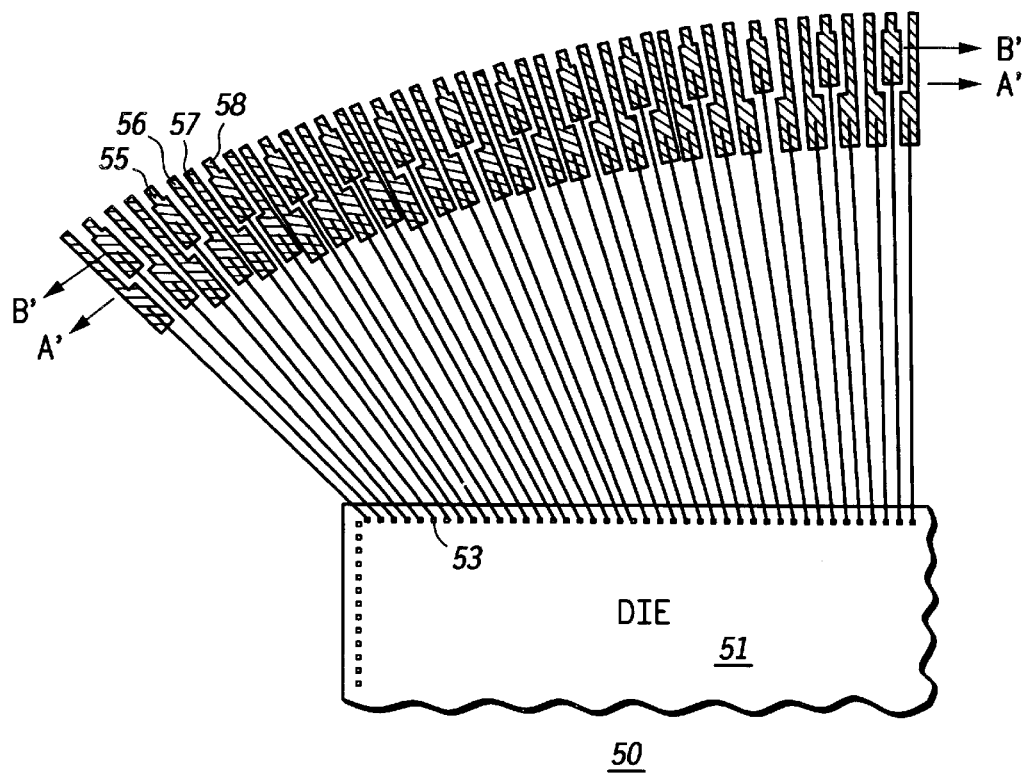
FIG. 4 illustrates in a top plan view an octant of a radial wire bond configuration in a circuit package in accordance with the present invention.

Illustrated in FIG. 4 is another embodiment of the present invention wherein a radial configuration is illustrated in connection with a semiconductor package 50. Semiconductor package 50 has a semiconductor die 51 having a plurality of bond pads such as bond pad 53. Connected to each of the bond pads is a bonding wire which is connected to a respective bond post, such as bond posts 56, 57 and 58. As with semiconductor package 34, semiconductor package 50 utilizes a staggered bond post configuration in which twice as many conductive bond posts are centered around an axis A' as the number of bond posts centered around an axis B'. It should be noted in FIG. 4 that the conductive bond posts are positioned in a configuration which is radial to the side of die 51 as opposed to being purely orthogonal as illustrated in FIG. 3. Also, axis A' and axis B' may define an arc of varying radius or may define a straight line of varying orientation. A further increase in the number of bond posts which can be provided for a side of a die is afforded by using the radial configuration illustrated in FIG. 4.

Figure 5:
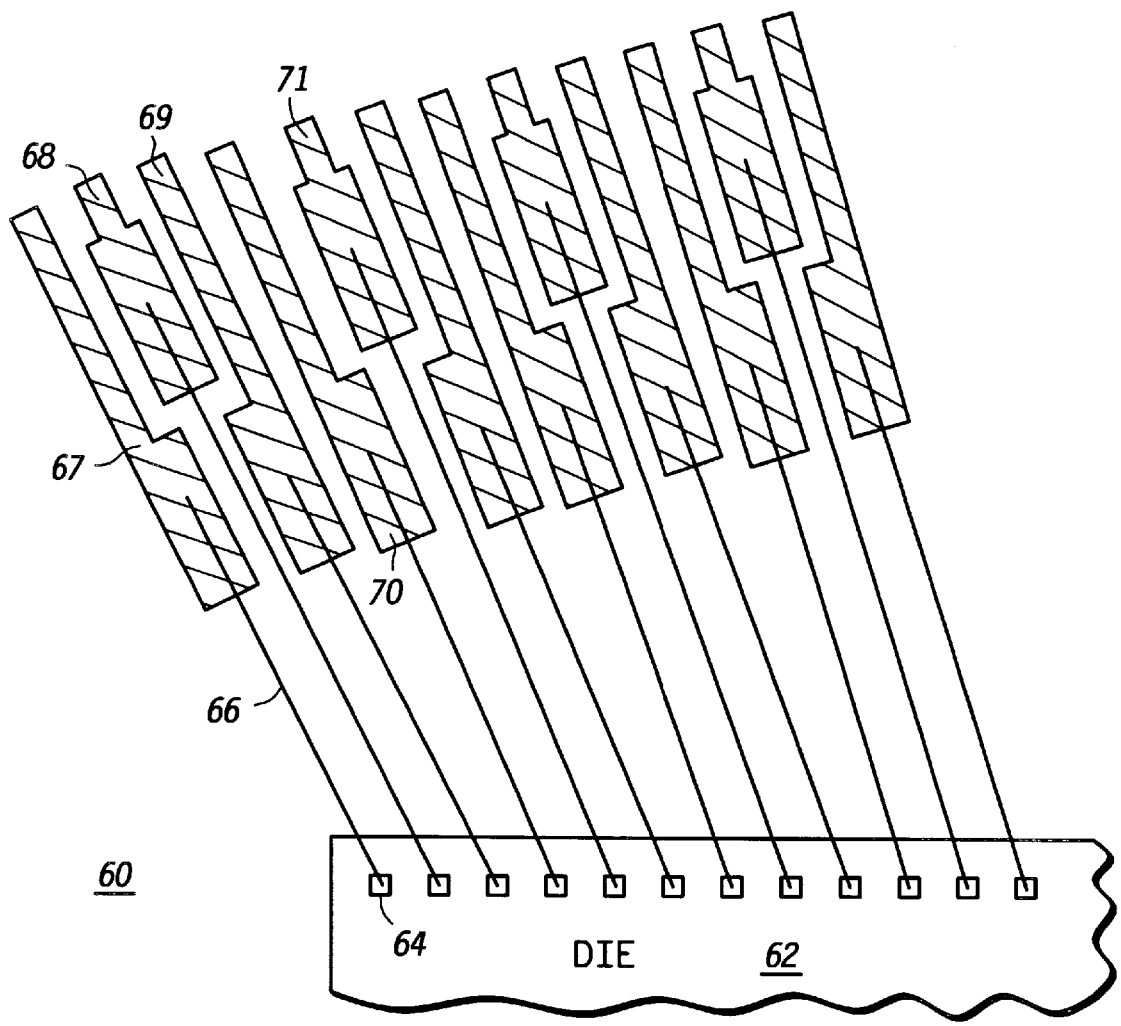
FIG. 5 illustrates in a top plan view a more detailed view of a radial wire bond configuration in a circuit package in accordance with the present invention.

Illustrated in FIG. 5 in greater detail is a corner of a semiconductor die using a radial bonding configuration as was illustrated in FIG. 4. A semiconductor package 60 has a die 62 having a plurality of bond pads such as bond pad 64. Bond pad 64 is connected by a bond wire 66 to a bond post 67. Additional bond posts include bond posts 68 and 69 associated with bond post 67. It should be noted that in the trilogy of bond posts 67, 68 and 69 that two bond posts 67 and 69 are placed in close proximity to die 62, whereas intervening bond posts 68 is staggered from bond posts 62 by substantially the length of the bond post dimension. Additionally, in order to fit more readily bond post 68 between bond posts 67 and 69, the conductive trace associated with each of bond posts 67 and 69 is off centered to the side opposite adjoining bond post 68. In this manner, maximum separation distance between the bonding wires, such as bond wire 66, is provided. The radial configuration of semiconductor package 60 in addition to the staggering of bonding post and the placement of off-centered traces along specific bond posts most closely positioned to die 62 affords for a very compact and size efficient integrated circuit package. Additionally, it should be noted that the wire lengths are within a very acceptable specified range. In particular, the wire length for wires associated with the inner-most bond post such as bond post 67 may be made very short as the conductive traces go outward from the die 62 and may be made as short as if the bond posts were orthogonal to the side of die 62. A very small increase in wire length is afforded for bond posts such as bond posts 68 and 71 due to the small increase in distance from the side of die 62.

Figure 6:
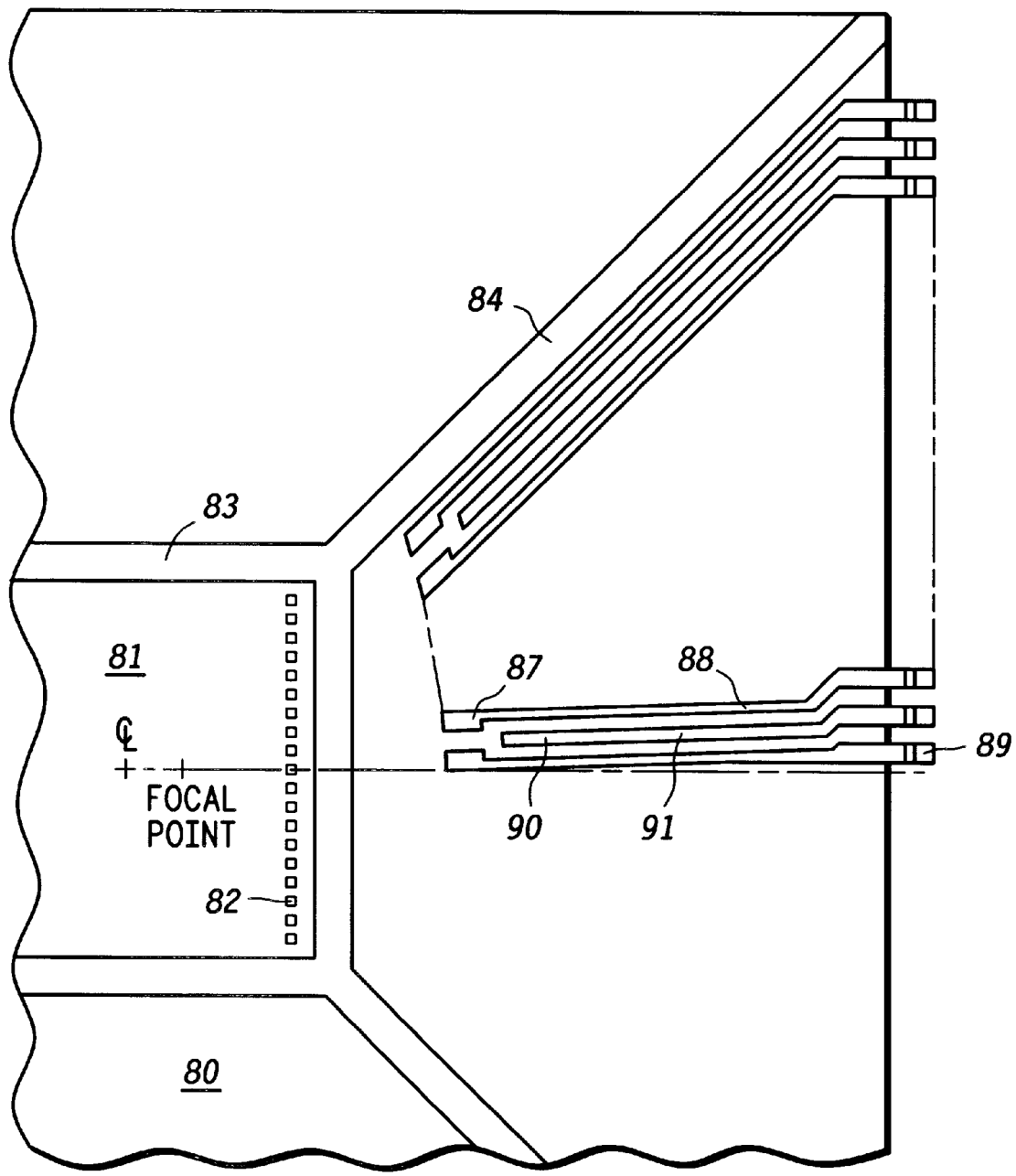
FIG. 6 illustrates an integrated circuit package in a lead frame which implements the present invention.

Illustrated in FIG. 6 is a semiconductor package 80 having a die 81 and associated bond pads such as bond pad 82. Surrounding die 81 is a die pad 83 which is connected at each of four corners by support bars such as a support bar 84. Support bar 84 extends from die pad 83 to a corner of semiconductor package 80. Die pad 83 and support bar 84 provide the frame which positions die 81 in semiconductor package 80. Additionally, a plurality of radially positioned bond posts such as bond post 87 are provided. Each bond post is connected to the perimeter of semiconductor package 80 by a conductive interlead such as conductive interleave 88. Conductive interleave 88 goes to the edge of semiconductor package 80 and makes connection with an outer lead such as outer lead 89. An additional bond post such as bond post 90 is positioned adjacent to bond post 87 and is connected to an outer lead of semiconductor package 80 via an interlead 91. It should be noted as in FIG. 5 that the radial configuration and the use of groups of 3 bond posts such as bond posts 87, 90 and a bond post 92 provide a very size-efficient semiconductor package. Additionally, each of the bond posts are centered toward a focal point of the integrated circuit package die as opposed to the absolute center of the die 81. The reason for centering the bond posts to the focal point is the use of support bars which are positioned to the center of die 81. In order to fit each of the bond posts within a quadrant of the semiconductor package 80, the focal point must be the point of focus for each of the bond posts rather than the center of the die 81. Again, it should be noted that the use of conductive interleads which are not centered exactly and the use of an intervening bond post between such positioned bond posts with a substantially centered interlead allows for a very compact bond post configuration. FIG. 6 illustrates the particular use of the present invention with a leaded package.

Figure 7:
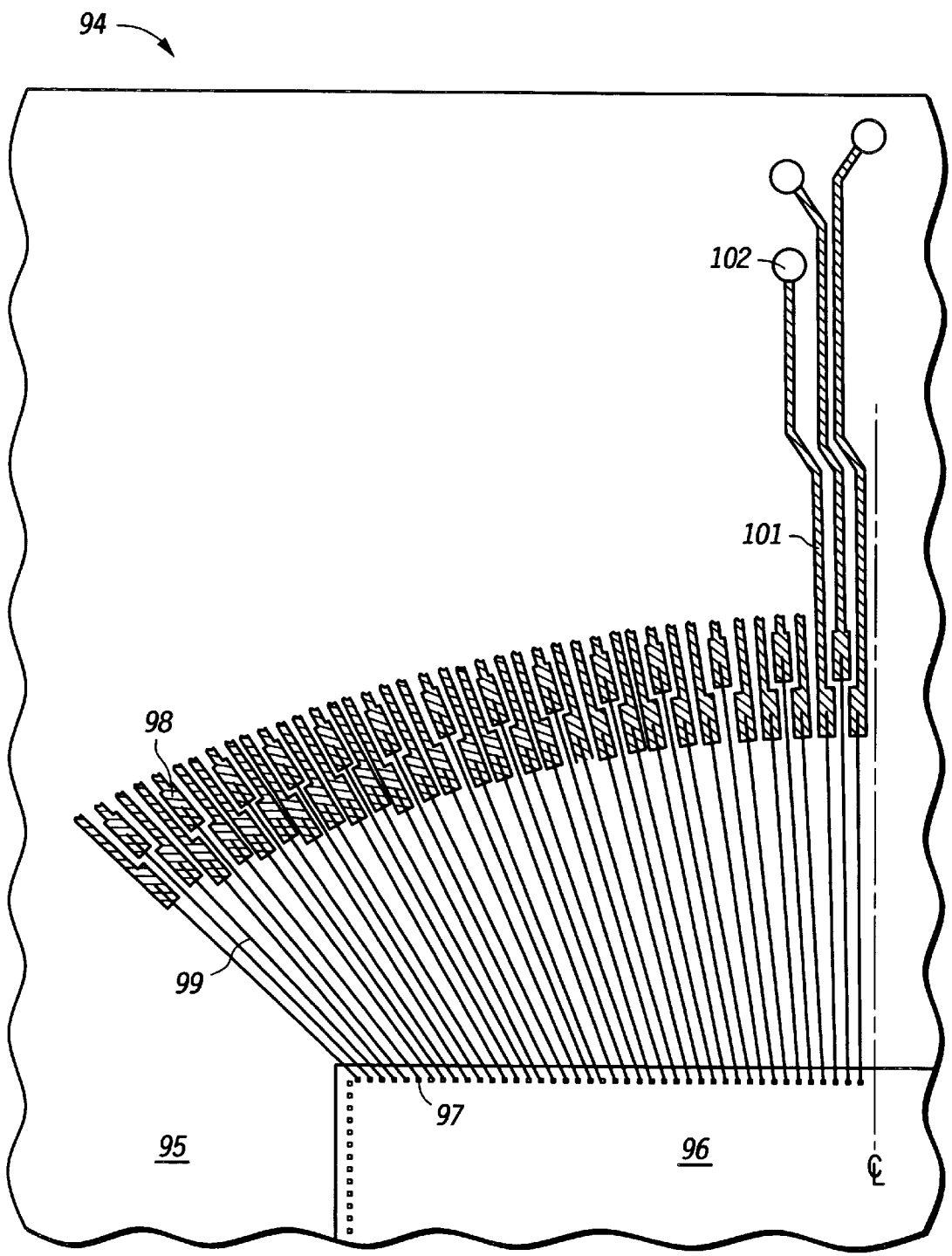
FIG. 7 illustrates in a top plan view an octant of an integrated circuit package implementing the present invention with a plastic ball grid array (PBGA).

Illustrated in FIG. 7 is an application of the present invention with a ball grid array (BGA) package. Alternate embodiments may include any number of package types, for example a plastic ball grid array, a ceramic ball grid array, a quad flat pack, small outline jerec, small outline integrated circuit, thin small outline package, dual in line package, pin grid array, and a tape automated bonding. Again in FIG. 7, the present invention is implemented using a radial bond post configuration in a semiconductor package 94 having a package substrate 95. Positioned on package substrate 95 is a die 96 having a plurality of bond pads such as bond pad 97. Connected to each bond pad is a bonding wire such as bonding wire 99 which connects a bonding pad to a conductive bond post such as bond post 98. It should be noted again that there is a 2:1 ratio of bond posts in an inner axis as compared to the number of bond posts associated with an outer axis. Additionally, all bond posts associated with the inner axis have the conductive trace off-centered to permit more room for intervening bond posts centered around the second axis. Each of the conductive bond posts has a conductive trace such as conductive trace 101 connected to a conductive terminal pad or lad such as conductive terminal pad 102. The resulting semiconductor package 94 is a typical BGA package which utilizes the present invention to enable a maximum amount of conductive bond posts to be positioned on a side of a highly integrated such as die 96. Alternate embodiments of the present invention may employ a single package layer or multiple package layers. According to one embodiment of the present invention, conductive bond posts and traces are formed in a top layer, conductive terminal pads for connection to solder balls are formed in a bottom layer, and there may be any number of layers between the top and bottom.

By now, it should be appreciated that there has been provided an improved semiconductor package which greatly enhances the number of bond post locations adjacent a side of a semiconductor die while minimizing the length of bond wires associated with each bond site. The present invention is not limited in form to a particular type of package. Although only a couple of types of packages have been illustrated herein, it should be readily apparent that the present invention may be utilized with other types of packages such as pin grid arrays (PGA) or any other wire bonded package. In one form, the selective use of off-centered traces connected to particular bond pads or bond cites and utilized in a staggered configuration provides a great enhancement in the number of pins which may be bonded per side of an integrated circuit. In another form, the use of radial staggering with all the traces associated with each bond site going in an outward direction from the semiconductor die greatly enhances the number of bond locations per side of an integrated circuit even if the use of non-balanced conductive traces to the bonding pads is implemented. Where there is no use of the feature of off-balancing the conductive trace from the bonding site the staggering proportion between bonding sites is approximately a 1:1 or 50/50 ratio. Further enhancement can be obtained if the 2:1 or 66/33 ratio of bonding sites is used in a staggered configuration. The present invention provides a semiconductor package which is able to minimize wire length and significantly increase the number of bond sites in a highly integrated integrated circuit. Without the present invention, alternatives such as flip chip packages which cost significantly more than wire bonded packages would be required. Therefore, the present invention results in reduced packaging costs while maintaining or increasing the reliability associated with the high pin count of very sophisticated integrated circuits.

Additional advantages of the present invention include the ability to make the bond pads associated with the axis closest to the semiconductor die very wide because there is plenty of room by alternating a bond pad site between two bond pads. As a result, the bond pad width of two-thirds of the bond sites can be made larger than the remaining one-third if required or necessary. Also, in connection with the 2:1 ratio in the configuration illustrated, 66% of the bonding wires are shorter and can bemade a minimum length from the side of the semiconductor die. Therefore, there is improved wire bond reliability and improved yield. Additionally, the shorter majority of wires results in a reduced amount of wire sweep which might occur during molding of the semiconductor package.

We claim:

1. A semiconductor package comprising:
   a die having a plurality of bond pads;
   a package layer having a plurality of conductive paths, each of the plurality of conductive paths having a conductive bond post at one end, wherein a first portion of the plurality of conductive bond posts is arranged along a first axis and a second portion of the plurality of conductive bond posts is arranged along a second axis, the first and second portions having different number of bond posts, each of the plurality of conductive bond posts having a center axis;
   a plurality of wire bonds electrically connecting the plurality of bond pads to the plurality of conductive bond posts;
   wherein conductive paths are selectively off-set from the center axis of the first portion of conductive bond posts.

2. A package as in claim 1, further wherein the first portion of conductive bond posts includes approximately 66 per cent of the plurality of conductive bond posts.

3. A package as in claim 1, wherein the first axis is between the die and the second axis.

4. A package as in claim 1, wherein the first and second axis are parallel to sides of the die.

5. A package as in claim 1, wherein the first and second axes are positioned radially around the die.

6. A package as in claim 5, wherein the die has a focal point, and the first portion of bond posts is within a 45° angle projection centered at the focal point with the center axis of each conductive bond post coincident with the focal point.

7. A package as in claim 5, wherein at least one of the plurality of conductive paths is directed towards the die.

8. A package as in claim 1, wherein the package is a ball pad grid array package.

9. A package as in claim 1, wherein the package has a leadframe.

10. A package as in claim 1, wherein a first gap between immediately adjacent conductive paths of two of the first portion of bond posts is substantially less than a second gap between immediately adjacent conductive paths of one of the first portion of bond posts and one of the second portion of bond posts.

11. A package as in claim 1, wherein the package is encapsulated with a molding component.

12. A package as in claim 1, wherein the package is encapsulated with a glob top.

13. A package as in claim 1, wherein the package is a wire bonded package.

14. A package as in claim 13, wherein the package is one of a plastic ball grid array, a ceramic ball grid array, a quad flat pack, a small outline "J" lead, a small outline integrated circuit, a thin small outline package, a dual in line package, a pin grid array, a plastic leaded chip carrier, or a tape automated bonding.

15. A ball grid array semiconductor device comprising:

a package substrate having a first plurality of conductive traces formed thereon and has a conductive bond post at an end of each trace, the package substrate having a plurality of conductive terminal pads arranged in an array configuration and electrically connected to the plurality of conductive traces, wherein the conductive bond posts are arranged along a first and a second axis, wherein the first axis contains a majority of the conductive bond posts;

a semiconductor die mounted to the package substrate, the die having a periphery and sides, and having a plurality of bond pads located about the periphery of the die, wherein the first and second axis on the package substrate are radially placed outside the periphery of the die; and a first plurality of wire bonds electrically connecting the plurality of bond pads of the semiconductor die to the conductive bond posts on the package substrate.

16. A device as in claim 15, wherein the first and second axes are proportionately placed within octants around the periphery of the die, the octants defined by angular projections from at least one focal point on the semiconductor die.

17. A device as in claim 15, wherein the first and second axis form an arc shape.

18. A device as in claim 15, wherein the conductive traces are directed from the conductive bond posts toward the semiconductor die.

19. A device as in claim 15, wherein the package substrate is an epoxy-glass based substrate.

20. A semiconductor package, comprising:

a die having a plurality of bond pads;

a staggered wirebonding configuration, the wirebonding configuration electrically coupled to the plurality of bond pads, the configuration comprising:

a first bond post having a conductive trace, the first bond post positioned on a first axis; and second and third bond posts positioned on a second axis, the second axis being a constant distance from the first axis, the second and third bond posts positioned on each side of the first bond post.

21. A semiconductor package as in claim 20, wherein the first axis is closer to the die than the second axis.

* * * * *